(12) United States Patent
Blin

(10) Patent No.: US 7,877,066 B2
(45) Date of Patent: Jan. 25, 2011

(54) TECHNIQUES TO REDUCE THE POWER CONSUMPTION OF AN RF LOG-AMP DETECTOR

(75) Inventor: Guillaume Blin, Malden, MA (US)

(73) Assignee: Paratek Microwave Inc, Nashua, NH (US)

( * ) Notice: Subject to any disclaimer, the term of this patent is extended or adjusted under 35 U.S.C. 154(b) by 740 days.

(21) Appl. No.: 11/800,571

(22) Filed: May 7, 2007

(65) Prior Publication Data

US 2008/0278237 A1      Nov. 13, 2008

(51) Int. Cl.
*H04B 1/04* (2006.01)
(52) U.S. Cl. .............. 455/127.1; 455/127.2; 455/127.3; 455/108; 455/126; 455/142
(58) Field of Classification Search .............. 455/127.1, 455/127.2, 127.3, 126, 108, 142
See application file for complete search history.

(56) References Cited

U.S. PATENT DOCUMENTS

| | | | |
|---|---|---|---|
| 2003/0139153 A1* | 7/2003 | McMorrow et al. | ......... 455/108 |
| 2006/0166633 A1* | 7/2006 | Mehr | ...................... 455/232.1 |
| 2007/0207749 A1* | 9/2007 | Rozenblit et al. | ........ 455/127.2 |
| 2008/0139144 A1* | 6/2008 | Behzad | ..................... 455/127.1 |

* cited by examiner

*Primary Examiner*—Sanh D Phu
(74) *Attorney, Agent, or Firm*—Ed Guntin; Guntin Meles & Gust

(57) ABSTRACT

An embodiment of the present invention provides an RF log-amp detector, comprising a pre-amplifer at the input of the RF log-amp detector, a plurality of limiters with variable gain connected to the pre-amplifier, wherein the gain of the preamplifier is set to its minimum and the dynamic range is expanded by modifying the amplification gain of the plurality of limiters, thereby increasing the dynamic range and reducing accuracy, after which a coarse measurement of a power level is taken and wherein the RF log-amp detector then defines which pre-amplification level is required based on the course measurement to bring the signal at the output of the preamp within an optimum dynamic range of the log-amp and wherein the pre-amplification gain is then set while the gain of the plurality of limiters are set to their minimum value with the RF log-amp then performing a second measurement with higher accuracy and calculating the final measurement from fine measurements and the pre-amplification gain.

19 Claims, 8 Drawing Sheets

US 7,877,066 B2

TECHNIQUES TO REDUCE THE POWER CONSUMPTION OF AN RF LOG-AMP DETECTOR

BACKGROUND OF THE INVENTION

Wireless devices have become prevalent throughout society. As users demand more mobility, there is a tremendous requirement for decreasing power consumption and thereby increasing battery life.

Thus, there is a strong need for techniques to reduce the power consumption of an RF log-amp detector that may be used in wireless devices.

SUMMARY OF THE INVENTION

An embodiment of the present invention provides an RF log-amp detector, comprising a pre-amplifier at the input of the RF log-amp detector, a plurality of limiters with variable gain connected to the pre-amplifier, wherein the gain of the preamplifier is set to its minimum and the dynamic range is expanded by modifying the amplification gain of the plurality of limiters, thereby increasing the dynamic range and reducing accuracy; after which a coarse measurement of a power level may be taken and wherein the RF log-amp detector then defines which pre-amplification level is required based on the course measurement to bring the signal at the output of the preamp within an optimum dynamic range of the log-amp and wherein the pre-amplification gain may then be set while the gain of the plurality of limiters are set to their minimum value with the RF log-amp then performing a second measurement with higher accuracy and calculating the final measurement from fine measurements and the pre-amplification gain.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Figure 1:
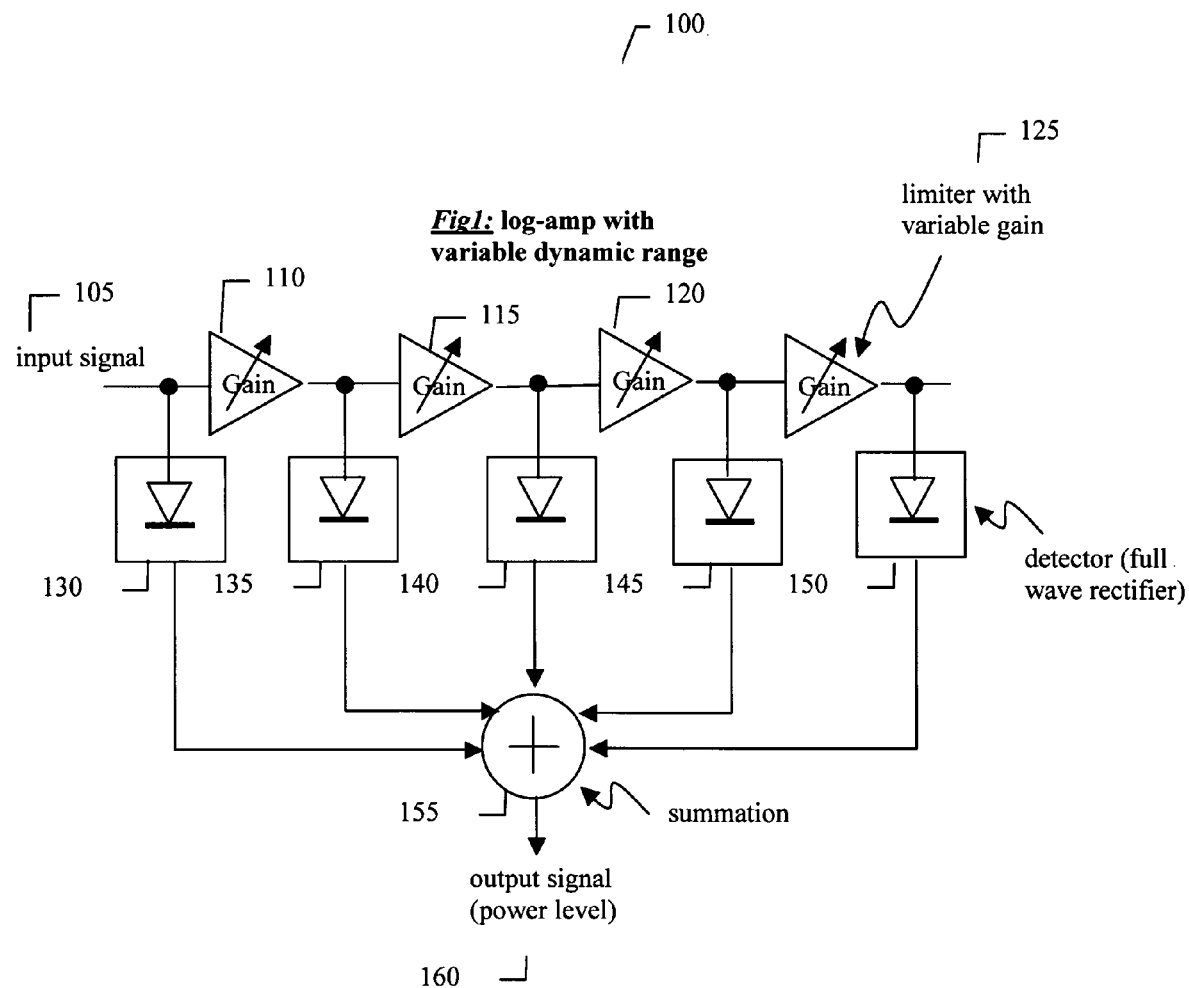
FIG. 1 illustrates a log-amp with variable dynamic range of an embodiment of the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

An embodiment of the present invention provides a two step measurements with the use of specific functions (blocks) to achieve these measurements. The first block may be a variable gain amplifier (VGA) or programmable gain amplifier (PGA) used as a pre-Amplifier. The second block may be a logarithmic detector with variable gain in a limiter (which may be referred to in the relevant art as fixed gain cells). Although the present invention is not limited in this respect.

In the method according to an embodiment of the present invention, the gain of the preamplifier may first be set to its minimum and the dynamic range of the log-amp may be expanded by modifying the amplification gain of several internal limiters. When the gain is increased, the dynamic range of the log-amp is increased but the accuracy is reduced. A coarse measurement of the power level is then performed.

Next, the previous measurement may be used to define which pre-amplification level is required to bring the signal at the output of the preamp within the optimum dynamic range of the log-amp. This pre-amplification gain may be set while the gain of the limiters in the log-amp are set to their minimum value. A second measurement may then be performed with higher accuracy and the final measurement may then be calculated from the fine measurement and the pre-amplification gain.

Turning to the figures, FIG. 1 is an illustration of a log-amp with variable dynamic range 100 of an embodiment of the present invention. As shown in FIG. 1, input signal 105 is provided to a plurality of limiters with variable gain 110-125 connected to full wave rectifiers 130-150, the output of which is summed at 155 and output at 160.

Figure 2:
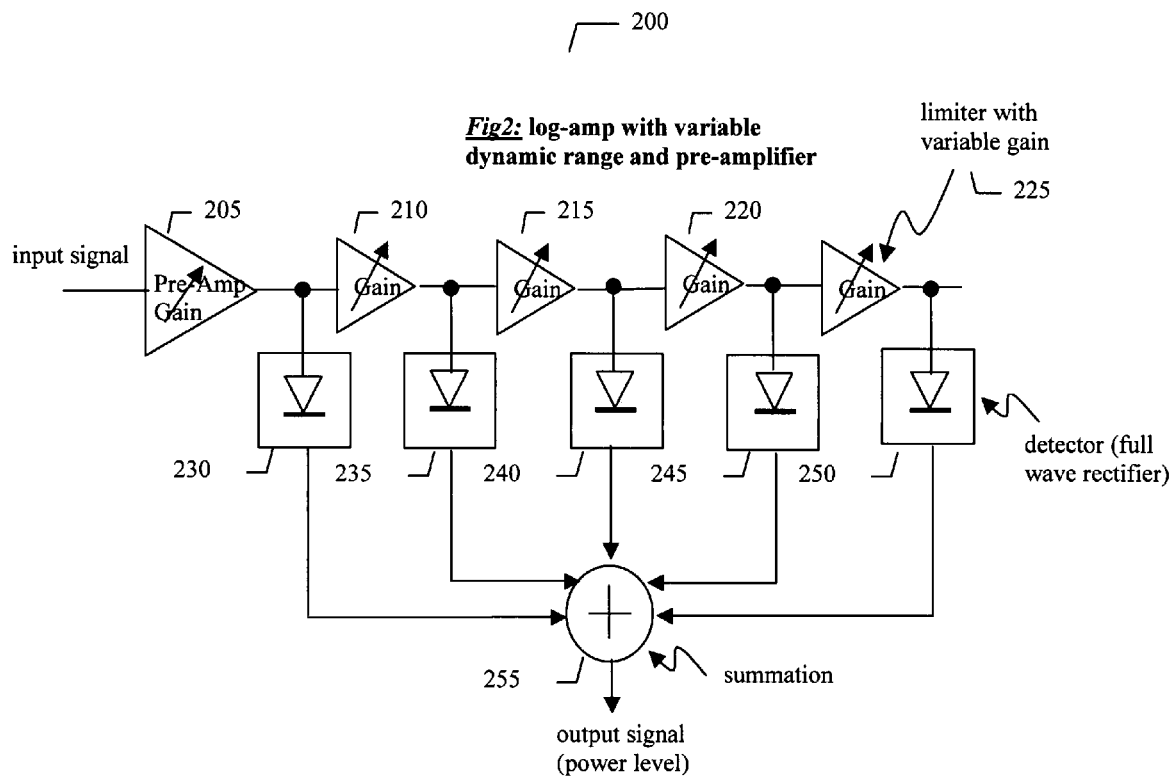
FIG. 2 illustrates a log-amp with a variable dynamic range and pre-amplifier of an embodiment of the present invention.

FIG. 2 illustrates a log-amp with a variable dynamic range and pre-amplifier of an embodiment of the present invention. The apparatus of FIG. 2 may comprise an RF log-amp detector 200 adapted to reduce power consumption while keeping accuracy and dynamic range by dynamically adapting an amplification gain within the detector 200 and adapting a pre-amplification gain at the input of the detector 200. This apparatus may further comprise a pre-amplifier 205 to adapt the pre-amplification gain at the input of the detector and wherein the pre-amplifier 205 may be a variable gain amplifier (VGA) or programmable gain amplifier (PGA). In an embodiment of the present invention the apparatus may further comprise at least one limiter 210-225 with variable gain connected to the pre-amplifier 205, wherein the gain of the preamplifier 205 may be set to its minimum and the dynamic range may be expanded by modifying the amplification gain of a plurality of limiters 210-225, thereby increasing the dynamic range and reducing accuracy. The apparatus may then take a coarse measurement of a power level. The RF log-amp detector 200 may then be adapted to define which pre-amplification level is required based on the previous measurement to bring the signal at the output of the pre-amp 205 within an optimum dynamic range of the log-amp and further adapted to set the pre-amplification gain while the gain of the plurality of limiters 210-225 are set to their minimum value and perform a second measurement with higher accuracy, and calculate the final measurement from fine measurement and the pre-amplification gain. Full wave detectors 230-250 connected to the plurality of limiters 210-225 are summed at 255 to provide output signal power level.

Figure 3:
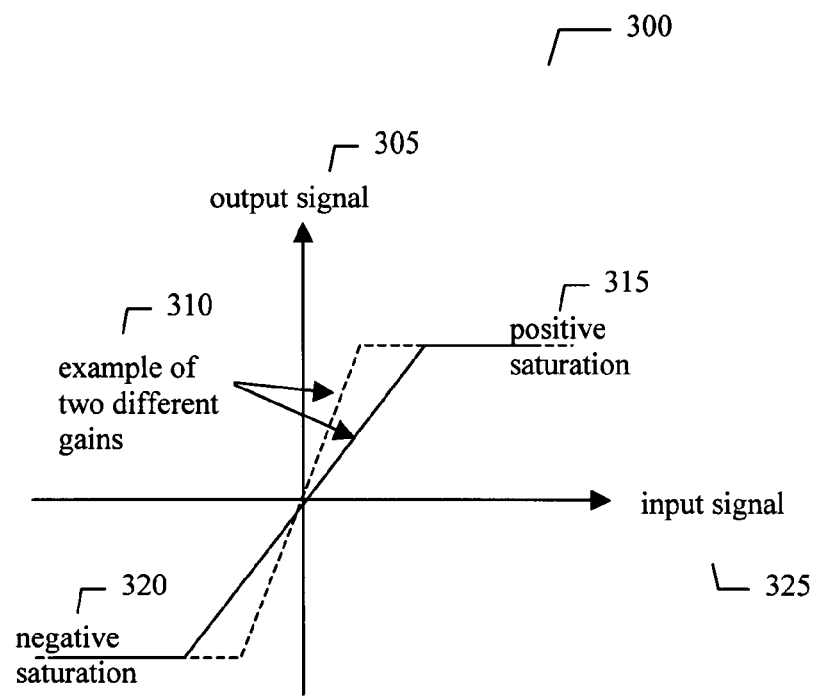
FIG. 3 depicts the characteristics of a limiter with variable gain of one embodiment of the present invention.

FIG. 3 graphically depicts the characteristics of a limiter with variable gain of one embodiment of the present invention with output signal 305 vs. input signal 325. At 310 is provided examples of two different gains with 315 illustrating positive saturation and 320 showing negative saturation.

Figure 4:
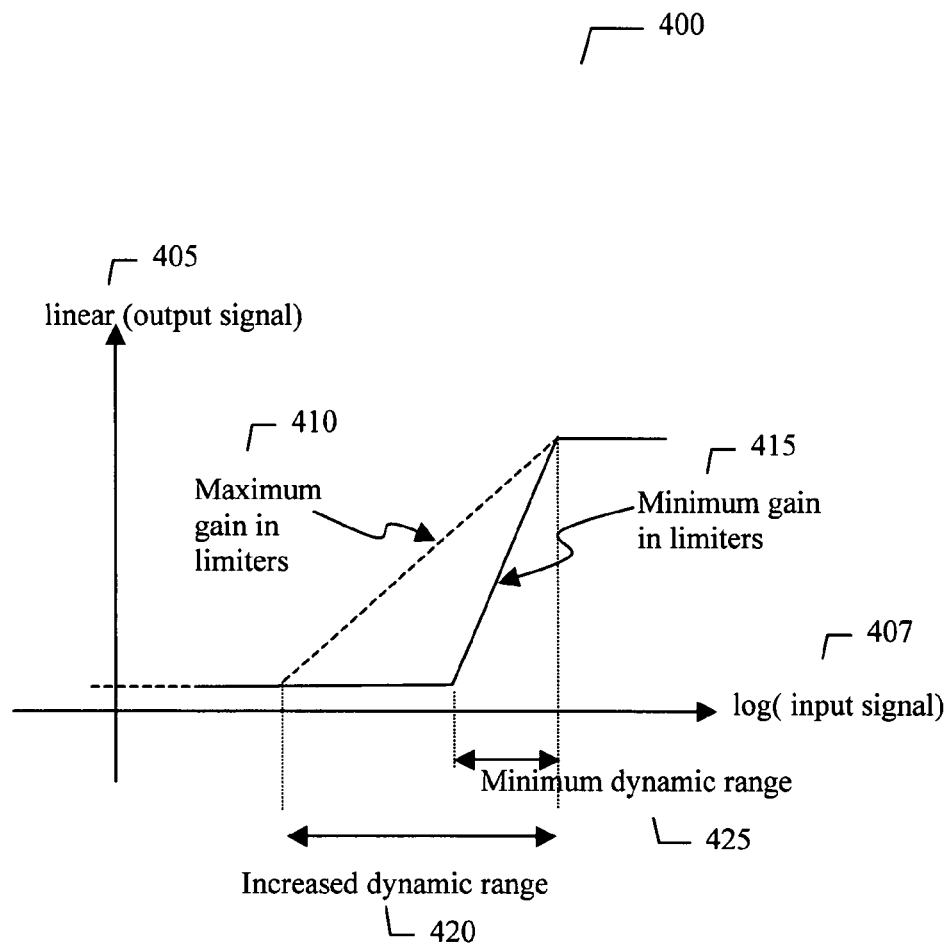
FIG. 4 depicts the effect of variable gain in a limiter on log-amp dynamic range of one embodiment of the present invention.

FIG. 4 graphically depicts, generally at 400, the effect of variable gain in a limiter on log-amp dynamic range of one embodiment of the present invention in linear output signal 405 vs. log input signal 407. Maximum gain in limiters is shown at 410 while the minimum gain in limiters is depicted at 415. The minimum dynamic range is shown at 425 with the increased dynamic range due to some embodiments of the present invention illustrated at 420.

Figure 5:
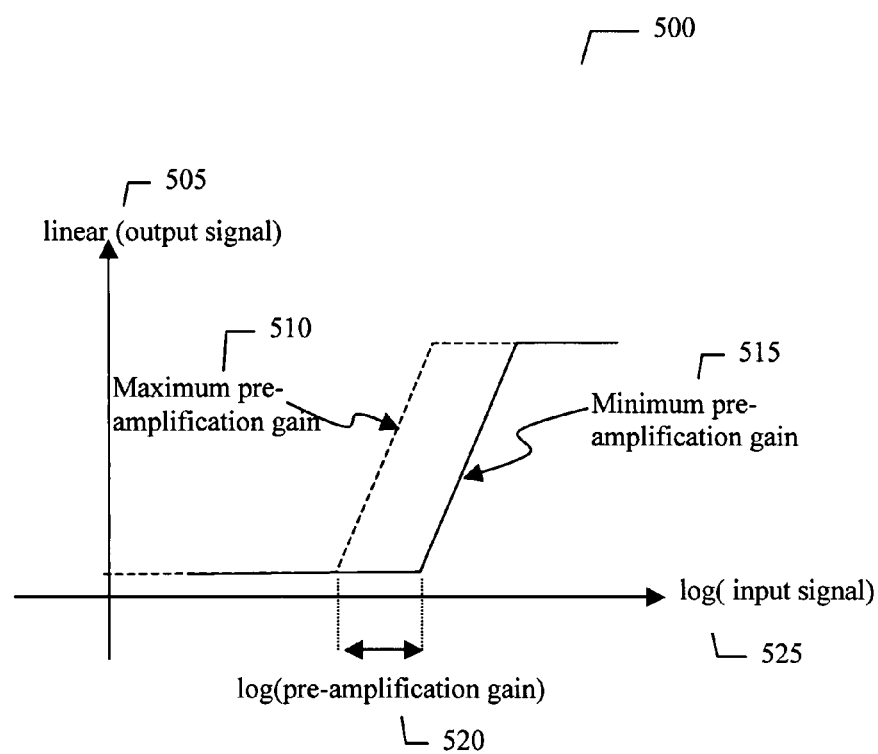
FIG. 5 depicts the effect of pre-amplification gain of one embodiment of the present invention.

Looking now at FIG. 5, generally at 500, is depicted in linear output signal 505 vs. log output signal 525, the effect of pre-amplification gain of one embodiment of the present invention. Maximum pre-amplification gain is shown at 510 and minimum pre-amplification gain shown at 515. The log pre-amplification gain on the log input signal axis is shown at 520.

Figure 6:
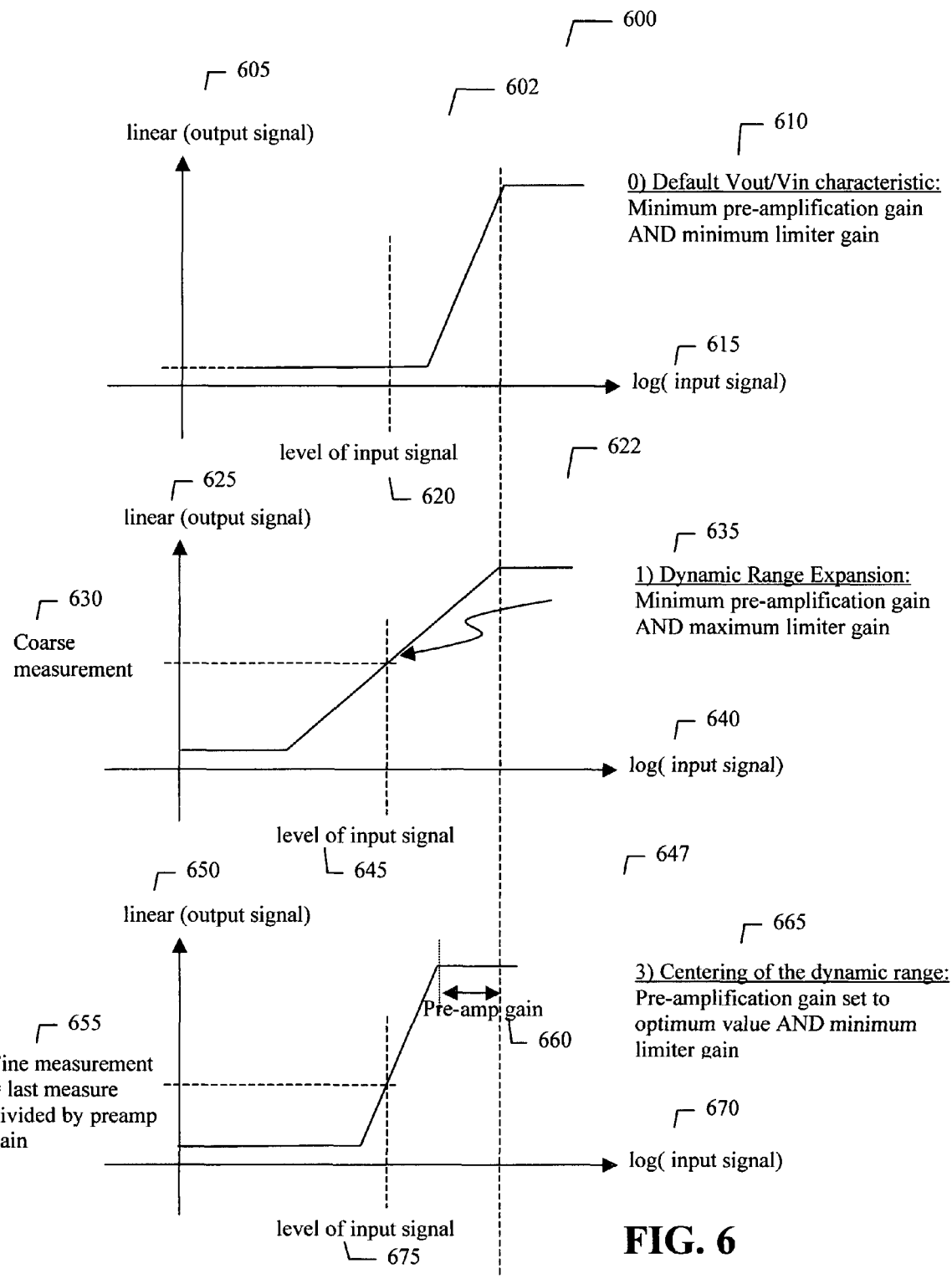
FIG. 6 illustrates the two step power measurement with preamp and log-amp with variable dynamic range of one embodiment of the present invention.

Turning now to FIG. 6, generally at 600, is illustrated the two step power measurement with preamp and log-amp with variable dynamic range of one embodiment of the present invention. The first graph 602 of FIG. 6 depicts linear output signal 605 vs log input signal 615 and wherein the default Vout/Vin characteristic is minimum pre-amplification gain and minimum limiter gain. The level of input signal is shown at 620.

The second graph of FIG. 6 is shown generally as 622, in linear output signal 625 vs. log input signal 640. The point on the graph 635 illustrates the dynamic range expansion with minimum pre-amplification gain and maximum limiter gain. The course measurement is shown at 630 and level in input signal is shown at 645.

The third graph of FIG. 6 is shown generally as 647, in linear output signal 650 vs. log input signal 670. The point on the graph 665 illustrates the centering of the dynamic range with pre-amplification gain set to optimum value and minimum limiter gain. The fine measurement equals last measure divided by preamp gain is shown at 655 crossing level of input signal at 675.

Figure 7:
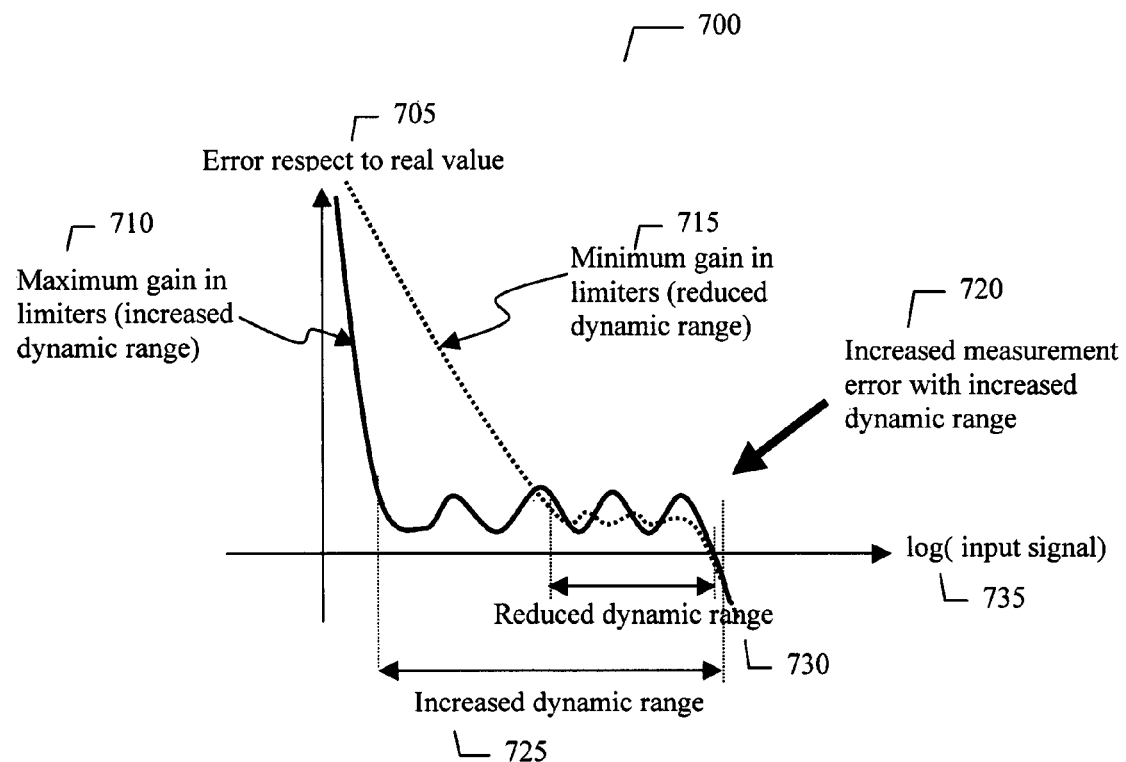
FIG. 7 graphically illustrates accuracy vs. dynamic range (pre-amp gain unchanged) of one embodiment of the present invention.

Turning to FIG. 7, 700 graphically illustrates accuracy in error with respect to real value 705 vs. dynamic range (preamp gain unchanged) in log input signal 735 of one embodiment of the present invention. 715 on the graph illustrates the minimum gain in limiters (reduced dynamic range); 720 shows the increased measurement error with increased dynamic range; and 710 shows the maximum gain in limiters (increased dynamic range). The section on the x-axis at 730 is the reduced dynamic range and 725 is the increased dynamic range.

Figure 8:
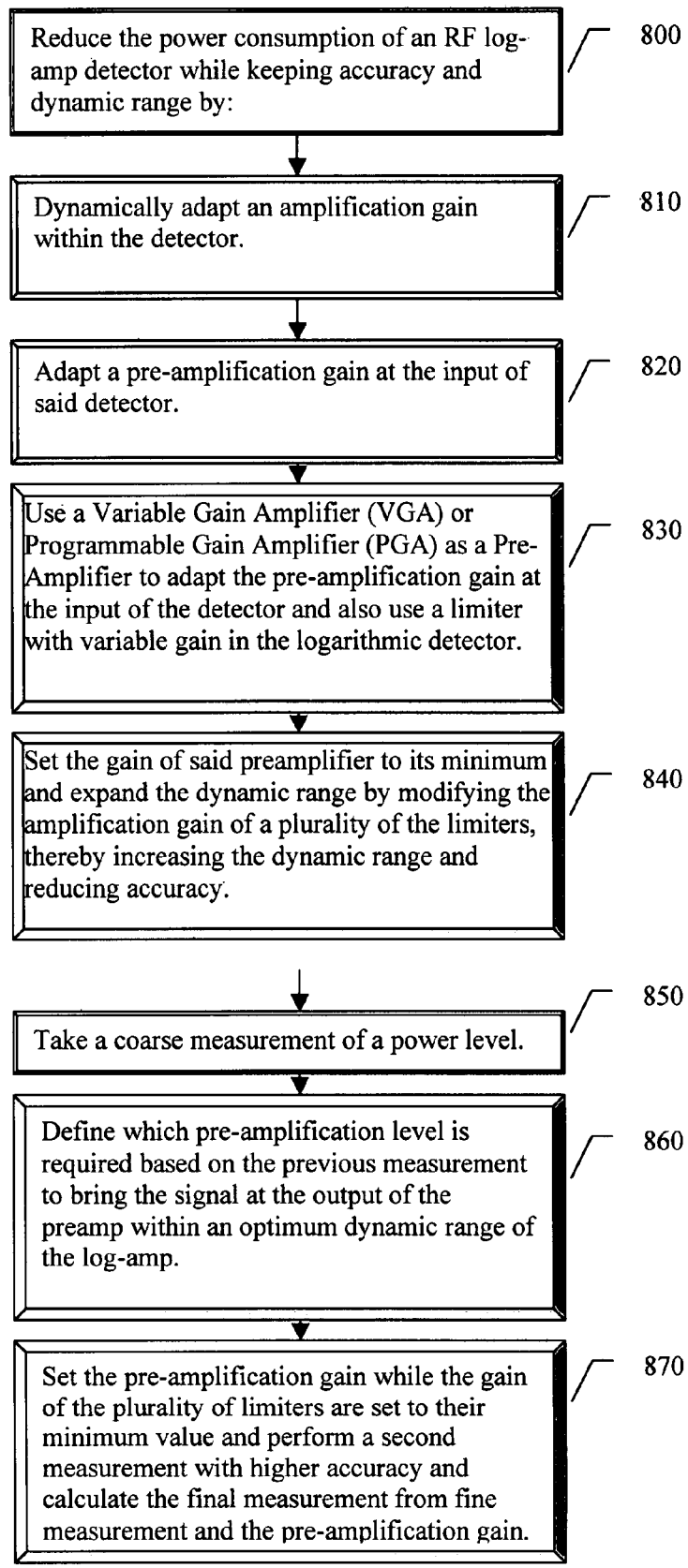
FIG. 8 illustrates a method for reducing power consumption of an RF log-amp detector.

FIG. 8 provides a method according to one embodiment of the present invention and provides reducing the power consumption of an RF log-amp detector while keeping accuracy and dynamic range 800 by dynamically adapting an amplification gain within the detector 810 and adapting a pre-amplification gain at the input of the detector 820. This method may further comprise using a Variable Gain Amplifier (VGA) or Programmable Gain Amplifier (PGA) as a Pre-Amplifier to adapt the pre-amplification gain at the input of the detector and also using a limiter with variable gain in the logarithmic detector 830. This method may further comprise setting the gain of the preamplifier to its minimum and expanding the dynamic range by modifying the amplification gain of a plurality of the limiters, thereby increasing the dynamic range and reducing accuracy 840 and still further comprise taking a coarse measurement of a power level 850. After which the present method defines which pre-amplification level is required based on the previous measurement to bring the signal at the output of the preamp within an optimum dynamic range of the log-amp 860. Next, in the present method may comprise setting the pre-amplification gain while the gain of the plurality of limiters are set to their minimum value and performing a second measurement with higher accuracy and calculating the final measurement from fine measurement and the pre-amplification gain 870.

Some embodiments of the present invention may be implemented, for example, using a machine-readable medium or article which may store an instruction or a set of instructions that, if executed by a machine, for example, by a microcontroller or by other suitable machines, cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Re-Writeable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-oriented, visual, compiled and/or interpreted programming language, e.g., C, C++, Java, BASIC, Pascal, Fortran, Cobol, assembly language, machine code, or the like.

In an embodiment of the present invention the machine-accessible medium that provides instructions, which when accessed, may cause the machine to perform operations comprising reducing the power consumption of an RF log-amp detector while keeping accuracy and dynamic range by dynamically adapting an amplification gain within the detector and adapting a pre-amplification gain at the input of the detector. The machine-accessible medium may further comprise the instructions causing the machine to perform operations further comprising using a Variable Gain Amplifier (VGA) or Programmable Gain Amplifier (PGA) as a Pre-Amplifier to adapt the pre-amplification gain at the input of the detector and using a limiter with variable gain in the logarithmic detector. In an embodiment of the present invention the machine-accessible medium may still further comprise the instructions causing the machine to perform operations further comprising setting the gain of the preamplifier to its minimum and expanding the dynamic range by modifying the amplification gain of a plurality of the limiters, thereby increasing the dynamic range and reducing accuracy. Still further, the machine-accessible medium may further comprise the instructions causing the machine to perform operations further comprising taking a coarse measurement of a power level and then define which pre-amplification level is required based on the previous measurement to bring the signal at the output of the preamp within an optimum dynamic range of the log-amp. Further instructions may cause the machine to perform operations further comprising setting the pre-amplification gain while the gain of the plurality of limiters are set to their minimum value and performing a second measurement with higher accuracy and calculating the final measurement from fine measurement and the pre-amplification gain.

Some embodiments of the present invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors or controllers, or devices as are known in the art. Some embodiments of the invention may include buffers, registers, stacks, storage units and/or memory units, for temporary or long-term storage of data or in order to facilitate the operation of a specific embodiment.

Yet another embodiment of the present invention provides an RF log-amp detector, comprising a pre-amplifier at the input of the RF log-amp detector, a plurality of limiters with variable gain connected to the pre-amplifier, wherein the gain of the preamplifier is set to its minimum and the dynamic range is expanded by modifying the amplification gain of the plurality of limiters, thereby increasing the dynamic range and reducing accuracy, after which a coarse measurement of a power level is taken and wherein the RF log-amp detector then defines which pre-amplification level is required based on the course measurements to bring the signal at the output of the preamp within an optimum dynamic range of the log-amp, and wherein the pre-amplification gain is then set while the gain of the plurality of limiters are set to their minimum value with the RF log-amp then performing a second measurement with higher accuracy and calculating the final measurement from fine measurement and the pre-amplification gain.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. A method, comprising:
  reducing the power consumption of an RF log-amp detector while keeping accuracy and dynamic range by dynamically adapting an amplification gain within said detector and adapting a pre-amplification gain at the input of said detector;
  using a plurality of limiters with variable gain in said logarithmic detector performing
  a first measurement of a power level; and
  setting said pre-amplification gain while the gain of said plurality of limiters are set to their minimum value and performing a second measurement of the power level, as a fine measurement, with higher accuracy than the first measurement; and
  calculating a final measurement of the power level from fine measurement and
  said pre-amplification gain.

2. The method of claim 1, further comprising
  using a Variable Gain Amplifier (VGA) or Programmable Gain Amplifier (PGA) as a Pre-Amplifier to adapt said pre-amplification gain at the input of said detector.

3. The method of claim 1, further comprising setting the gain of said preamplifier to its minimum and expanding the dynamic range by modifying the amplification gain of a plurality of said limiters, thereby increasing the dynamic range and reducing accuracy.

4. The method of claim 3, further comprising taking a coarse measurement of a power level.

5. The method of claim 4, further comprising defining which preamplification level is required based on said previous measurement to bring the signal at the output of said preamp within an optimum dynamic range of said log-amp.

6. An apparatus, comprising:
  an RF log-amp detector adapted to reduce power consumption while keeping accuracy and dynamic range by dynamically adapting an amplification gain within said detector and adapting a pre-amplification gain at the input of said detector;
  wherein the apparatus takes a first measurement of a power level; and
  wherein said RF log-amp detector is adapted to set said pre-amplification gain while the gain of a plurality of limiters are set to their minimum value and perform a second measurement, as a fine measurement, of the power level with higher accuracy than the first measurement and calculate a final measurement of the power level from the fine measurement and said pre-amplification gain.

7. The apparatus of claim 6, further comprising a Pre-Amplifier to adapt said pre-amplification gain at the input of said detector.

8. The apparatus of claim 7, wherein said pre-amplifier is selected from the group consisting of: a variable Gain Amplifier (VGA); or programmable gain amplifier (PGA).

9. The apparatus of claim 7, further comprising at least one limiter with variable gain connected to said pre-amplifier.

10. The method of claim 9, wherein the gain of said preamplifier is set to its minimum and the dynamic range is expanded by modifying the amplification gain of a plurality of limiters, thereby increasing the dynamic range and reducing accuracy.

11. The apparatus of claim 10, wherein take a coarse measurement of a power level.

12. The apparatus of claim 11, wherein said RF log-amp detector is adapted to define which pre-amplification level is required based on. said previous measurement to bring the signal at the output of said preamp within an optimum dynamic range of said log-amp.

13. A machine-accessible medium that provides instructions, which when accessed, cause a machine to perform operations comprising:
reducing the power consumption of an RF log-amp detector while keeping accuracy and dynamic range by dynamically adapting an amplification gain within said detector and adapting a pre-amplification gain at the input of said detector;
taking a first measurement of a power level; and
setting said pre-amplification gain while the gain of a plurality of limiters are set to their minimum value and performing a second measurement, as a fine measurement, of the power with higher accuracy than the first measurement and calculating a final measurement of the power level from fine measurement and said pre-amplification gain.

14. The machine-accessible medium of claim 13, further comprising said instructions causing said machine to perform operations further comprising using a Variable Gain Amplifier (VGA) or Programmable Gain Amplifier (PGA) as a Pre-Amplifier to adapt said pre-amplification gain at the input of said detector.

15. The machine-accessible medium of claim 14, further comprising said instructions causing said machine to perform operations further comprising using a limiter with variable gain in said logarithmic detector.

16. The machine-accessible medium of claim 15, further comprising said instructions causing said machine to perform operations further comprising setting the gain of said preamplifier to its minimum and expanding the dynamic range by modifying the amplification gain of the plurality of said limiters, thereby increasing the dynamic range and reducing accuracy.

17. The machine-accessible medium of claim 16, further comprising said instructions causing said machine to perform operations further comprising taking a coarse measurement of a power level.

18. The machine-accessible medium of claim 17, further comprising said instructions causing said machine to perform operations further comprising defining which pre-amplification level is required based on said previous measurement to bring the signal at the output of said preamp within an optimum dynamic range of said log-amp.

19. An RF log-amp detector, comprising:
a pre-amplifier at the input of said RF log-amp detector;
a plurality of limiters with variable gain connected to said pre-amplifier;
wherein the gain of said preamplifier is set to its minimum and the dynamic range is expanded by modifying the amplification gain of said plurality of limiters, thereby increasing the dynamic range and reducing accuracy, after which a coarse measurement of a power level is taken and wherein said RF log-amp detector then defines which pre-amplification level is required based on said course measurements to bring the signal at the output of said preamp within an optimum dynamic range of said log-amp; and
wherein said pre-amplification gain is then set while the gain of said plurality of limiters are set to their minimum value with said RF log-amp then performing a second measurement, as a fine measurement, of the power level with higher accuracy than the coarse measurement and calculating a final measurement of the power level from fine measurement and said pre-amplification gain.

\* \* \* \* \*